United States Patent
Palit

(10) Patent No.: US 10,250,978 B1
(45) Date of Patent: Apr. 2, 2019

(54) VOICE COIL TEMPERATURE CONTROL BASED ON AN ESTIMATED VOICE COIL TEMPERATURE AND A THRESHOLD

(71) Applicant: TEXAS INSTRUMENTS INCORPORATED, Dallas, TX (US)

(72) Inventor: Supriyo Palit, Kolkata (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/042,034

(22) Filed: Jul. 23, 2018

(30) Foreign Application Priority Data

Feb. 26, 2018 (IN) .............................. 201841007125

(51) Int. Cl.
| | |
|---|---|
| H04R 3/00 | (2006.01) |
| H04R 3/04 | (2006.01) |
| H03G 3/30 | (2006.01) |
| H03F 1/30 | (2006.01) |
| H03F 3/183 | (2006.01) |
| H03G 3/00 | (2006.01) |

(52) U.S. Cl.
CPC .............. *H04R 3/007* (2013.01); *H03F 1/30* (2013.01); *H03F 3/183* (2013.01); *H03G 3/001* (2013.01); *H03G 3/3005* (2013.01); *H04R 3/04* (2013.01); *H03F 2200/468* (2013.01); *H03G 2201/103* (2013.01)

(58) Field of Classification Search
None
See application file for complete search history.

(56) References Cited

U.S. PATENT DOCUMENTS

| | | | | |
|---|---|---|---|---|
| 2013/0083928 A1* | 4/2013 | Williams | ............... | H03G 7/002 381/55 |
| 2014/0169571 A1* | 6/2014 | Polleros | ................. | H04R 3/007 381/55 |
| 2015/0215704 A1* | 7/2015 | Magrath | ................. | H04R 9/022 381/55 |
| 2016/0142819 A1* | 5/2016 | Yasuda | ................. | H04R 29/003 381/55 |
| 2017/0094408 A1* | 3/2017 | Napoli | .................... | H03G 3/001 |
| 2017/0105068 A1* | 4/2017 | Lesso | ..................... | H04R 3/007 |
| 2018/0014121 A1* | 1/2018 | Lawrence | .............. | H04R 3/007 |
| 2018/0213322 A1* | 7/2018 | Napoli | ................... | H04R 3/007 |
| 2018/0279044 A1* | 9/2018 | Thormundsson | ...... | H04R 3/007 |

* cited by examiner

*Primary Examiner* — Paul W Huber
(74) *Attorney, Agent, or Firm* — John R. Pessetto; Charles A. Brill; Frank D. Cimino

(57) ABSTRACT

A system includes a gain control circuit configured to dynamically select a gain value based on an estimated temperature for a speaker voice coil, a base gain value, and a threshold temperature value. The system also includes a power control circuit configured to determine a power limit value based on the gain value. The system also includes a filter circuit configured to adjust values of a digitized audio signal based on the power limit value. The system also includes a digital-to-analog converter (DAC) coupled to the filter circuit and configured to convert a digital output of the filter circuit to an analog audio signal.

20 Claims, 7 Drawing Sheets

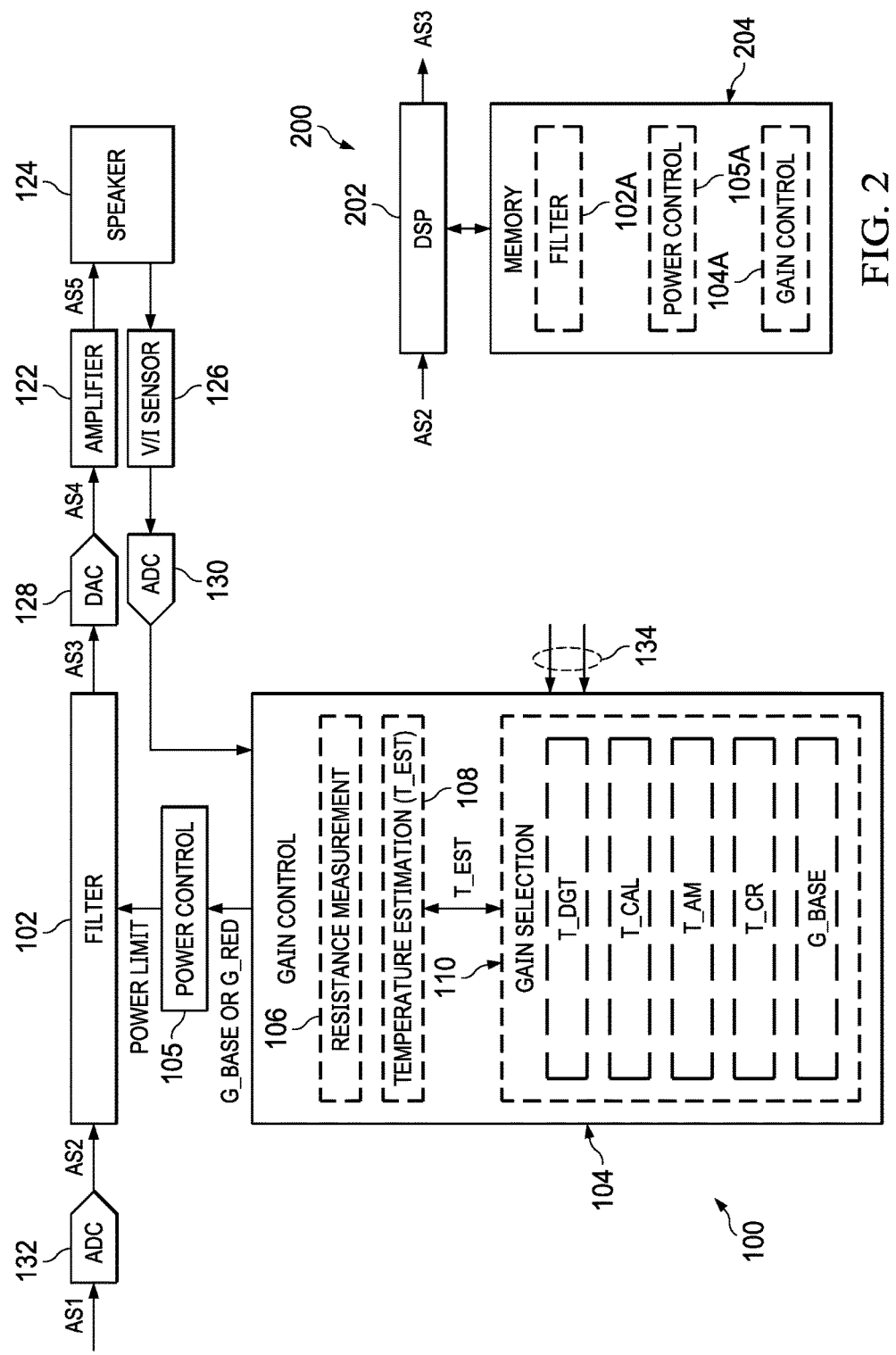

VOICE COIL TEMPERATURE CONTROL BASED ON AN ESTIMATED VOICE COIL TEMPERATURE AND A THRESHOLD

CROSS-REFERENCE TO RELATED APPLICATIONS

The present application claims priority to India Provisional Patent Application No. 201841007125, filed Feb. 26, 2018, titled "A Novel Dynamic Gain Compensation Algorithm for Temperature Control of the Voice Coil of a Speaker," which is hereby incorporated herein by reference in its entirety.

BACKGROUND

Speakers in consumer products (e.g., speakers in a mobile phone or tablet) are prone to mechanical and/or thermal failures if driven at high power levels. As the temperature of speaker components increases at high power levels, the likelihood of damage such as burn-out of the voice coil, melting of the insulation, and/or crumbling of the suspension increases. Despite being prone to thermal failures, there is an ever increasing demand in the market for louder audio from smaller speakers.

To prevent mechanical and/or thermal failures of speakers, existing system designs attempt to maintain the power level to the speaker voice coil within a safe operating range. Such attempts can be passive or dynamic. Dynamically controlling the power level to the speaker voice coil to avoid mechanical and/or thermal failures is challenging due to several variables, including changes to the ambient temperature within a consumer device with a speaker. For example, the ambient temperature within a mobile device changes due to surrounding atmospheric conditions, the variable operation of circuits within the mobile device, and/or the variable operation of the speaker. Due to issues such as the ambient temperature within a consumer device (e.g., a mobile device) being affected by multiple changing variables, the ambient temperature at difference locations within the device being different, and the speaker being positioned separate from other electronics, the ambient temperature at any location in the device is not an accurate measure of the ambient temperature within the speaker. Also, employing a temperature sensor at the location of the speaker is expensive and/or problematic. Due to the difficulty in tracking speaker ambient temperature directly, existing temperature control loops often compromise speaker volume to ensure speaker components are protected from mechanical and/or thermal failure.

SUMMARY

In accordance with at least one example of the disclosure, a system comprises a gain control circuit configured to dynamically select a gain value based on an estimated temperature for a speaker voice coil, a base gain value, and a threshold temperature value. The system also comprises a power control circuit configured to determine a power limit value based on the gain value. The system also comprises a filter circuit configured to adjust values of a digitized audio signal based on the power limit value. The system also comprises a digital-to-analog converter (DAC) coupled to the filter circuit and configured to convert a digital output of the filter circuit to an analog audio signal.

In accordance with at least one example of the disclosure, an amplifier device comprises circuitry configured to dynamically select a gain value based on an estimated temperature for a speaker voice coil, a base gain value, and a threshold temperature value, to determine a power limit value based on the gain value, and to filter a digitized audio signal based on the power limit value. The amplifier device also comprises a digital-to-analog converter (DAC) coupled to the circuitry and configured to convert a digital output of the circuitry to an analog audio signal. The amplifier device also comprises an amplifier configured to receive the analog audio signal and to provide an amplified version of the analog audio signal to a speaker associated with the speaker voice coil.

In accordance with at least one example of the disclosure, an audio signal amplification method comprises receiving a digitized audio signal. The method also comprises selecting a gain value for a gain control circuit based on an estimated temperature for a speaker voice coil, a base gain value, and a threshold temperature value. The method also comprises determining a power limit value based on the gain value. The method also comprises filtering the digitized audio signal based on the power limit value. The method also comprises converting a result of the filtering into an analog audio signal, and amplifying the analog audio signal.

BRIEF DESCRIPTION OF THE DRAWINGS

For a detailed description of various examples, reference will now be made to the accompanying drawings in which:

FIG. 1 shows a block diagram of an audio system in accordance with various examples;

FIG. 2 shows a block diagram of control components for an audio system in accordance with various examples;

DETAILED DESCRIPTION

Figure 3:
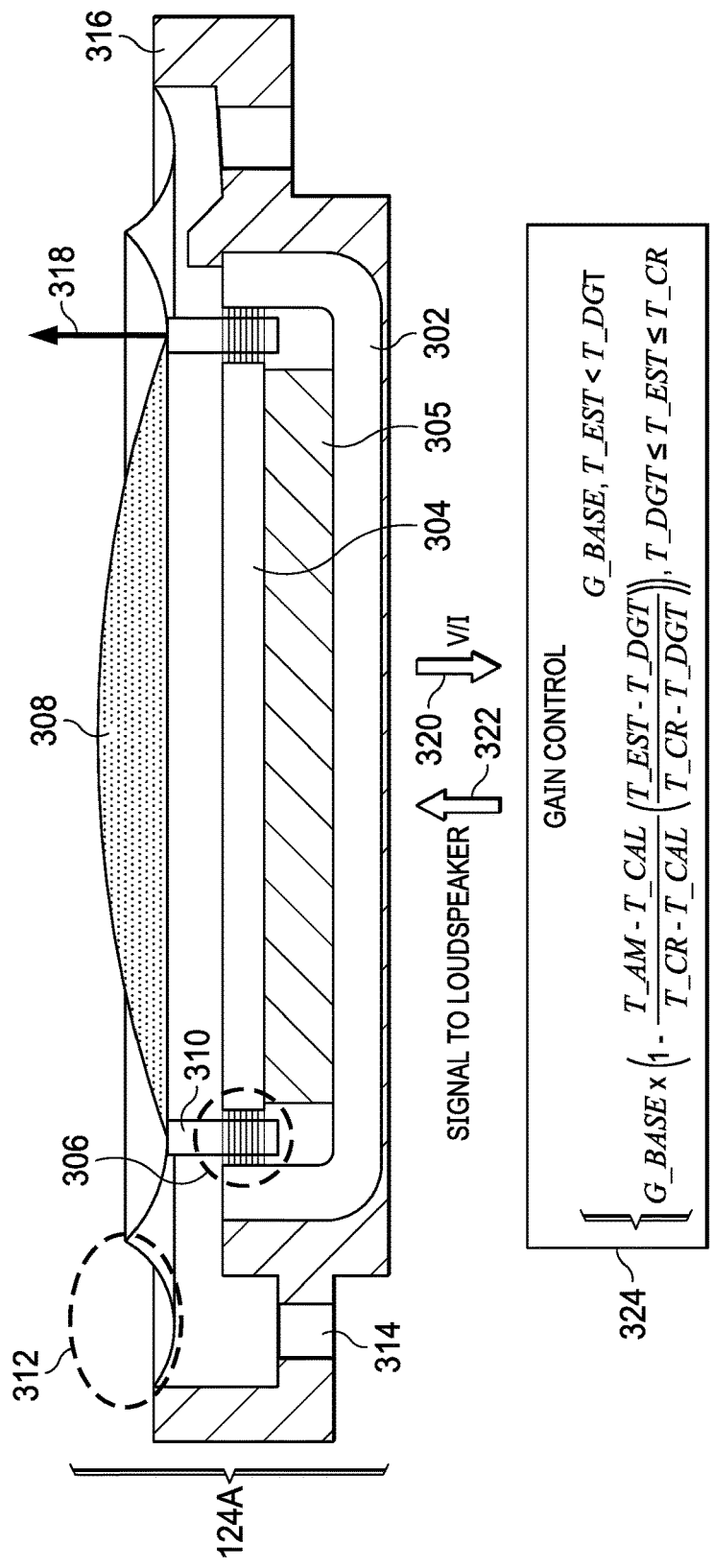
FIG. 3 shows a cross-sectional view of a speaker and a gain control block for the speaker in accordance with various examples.

The disclosed examples are directed to temperature control for a speaker based on an estimated speaker voice coil temperature and a threshold. In accordance with at least some examples, temperature control is achieved using an audio signal amplification technique, where the audio signal input to an amplifier has been modified using a filter controlled by a power limit value. In some examples, the power limit value is controlled by a power control circuit based on a gain value provided by a gain control circuit.

More specifically, in some examples, the gain value provided by the gain control circuit is selected based on the estimated speaker voice coil temperature, a base gain value, and a threshold temperature value. When the estimated speaker voice coil temperature is below the threshold temperature value, the gain control circuit selects the base gain value as the gain value to provide to the power control circuit. Otherwise (when the estimated temperature for the speaker voice coil is equal to or greater than the threshold temperature value), the gain control circuit selects a reduced gain value relative to the base gain value as the gain value to provide to the power control circuit. In some examples, the reduced gain value is a function of the base gain value and a variable gain reduction factor. In one example, the variable gain reduction factor is a function of a maximum ambient temperature value, the estimated temperature for the speaker voice coil, a temperature rating for the speaker voice coil, an ambient temperature value, and the threshold temperature value.

In some examples, gain control operations are performed by a dedicated gain control circuit or programmable component. In other examples, gain control operations are performed by a digital signal processor that executes gain control instructions stored in memory. As used herein, a "gain control circuit" corresponds to a dedicated circuit, one or more programmable components, and/or a processor that executes instructions stored in memory to achieve the gain control operations described herein.

In some examples, power control operations are performed by a dedicated power control or programmable component. In other examples, power control operations are performed by a digital signal processor that executes power control instructions stored in memory. As used herein, a "power control circuit" corresponds to a dedicated circuit, one or more programmable components, and/or a processor that executes instructions stored in memory to achieve the power control operations described herein.

In some examples, filter operations are performed by a dedicated filter circuit or programmable component. In other examples, filter operations are performed by a digital signal processor that executes filter instructions stored in a memory. As used herein, a "filter circuit" corresponds to a dedicated circuit, one or more programmable components, and/or a processor that executes instructions stored in memory to achieve the filter operations described herein.

In some examples, the gain control circuit, the power control circuit, and the filter are part of an audio signal amplification system, where the filter adjusts an audio signal based on a power limit value provided by the power control circuit, where the power limit value is based on a gain value provided by the gain control circuit (e.g., the filter performs a power compression operation). The filter circuit output is eventually amplified and provided to a speaker. In some examples, the gain control circuit, the power control circuit, and the filter circuit are part of an audio signal amplifier device (e.g., one or more integrated circuits in a package) included in a consumer device (e.g., a mobile device) with a speaker. Example consumer devices include cellular phones or tablets. In different examples, an audio signal amplifier device includes other components such as analog-to-digital converters (ADCs), digital-to-analog converters (DACs), voltage and current sensors, and an amplifier.

In some examples, the current and voltage levels for the speaker are monitored and are used to determine a resistance of the speaker voice coil from which the estimated speaker voice coil temperature is obtained. Meanwhile, the other variables used for gain control operations (e.g., a maximum ambient temperature value, a temperature rating for the speaker voice coil, an ambient temperature value, and the threshold temperature value) correspond to measured or predetermined values. In some examples, the maximum ambient temperature value is a predetermined value (e.g., a value between 60-80 degrees Celsius), the temperature rating for the speaker voice coil is a predetermined value (e.g., a value between 85-100 degrees Celsius), the ambient temperature value is a measured value (e.g., a value between 0 and 20 degrees Celsius), and the threshold temperature value is a predetermined value (e.g., a value 5-25 degrees Celsius below the temperature rating for the speaker voice coil). In some examples, one or more of the predetermined values used for gain control operations are adjustable. To provide a better understanding, various gain control options, audio signal amplifier options, and related components are described using the figures as follows.

FIG. 1 shows a block diagram of a system 100 in accordance with various examples. As shown, the system 100 comprises a filter circuit 102 coupled to a power control circuit 105. The power control circuit 105 also couples to a gain control circuit 104. In operation, the gain control circuit 104 outputs a gain value to the power control circuit 105, which adjusts a power limit value used by the filter circuit 102. In different examples, the filter circuit 102 corresponds to a dedicated circuit, one or more programmable components, and/or a processor that executes instructions stored in memory to achieve the filter operations described herein. Likewise, in different examples, the gain control circuit 104 corresponds to a dedicated circuit, one or more programmable components, and/or a processor that executes instructions stored in memory to achieve the gain control operations described herein. Likewise, in different examples, the power control circuit 105 corresponds to a dedicated circuit, one or more programmable components, and/or a processor that executes instructions stored in memory to achieve the power control operations described herein.

In operation, the filter circuit 102 adjusts values of a digitized audio signal (AS2) based on a power limit value provided by the power control circuit 105, where the power limit value is a function of the gain value provided by the gain control circuit 104. In the example of FIG. 1, AS2 is a digitized version of an analog audio signal (AS1), where ADC 132 provides AS2 based on AS1. The output of the filter circuit 102 is a filtered digital audio signal (AS3) that is converted to a corresponding analog audio signal (AS4) by DAC 128. AS4 is fed into an amplifier 122 to provide an amplified analog audio signal (AS5) for the speaker 124. During speaker operations, voltage and currents measurements for the speaker 124 are collected by a voltage/current sensor 126. These voltage and current measurements are digitized by ADC 130 and provided to the gain control circuit 104.

As described herein, the gain value provided by the gain control circuit 104 to the power control circuit 105 is dynamically selected. In some examples, selection of the gain value by the gain control circuit 104 involves various operations including determining the resistance of a voice coil associated with the speaker 124 based on the voltage and current measurements collected by the voltage/current sensor 126. In the example system 100 of FIG. 1, this resistance measurement is performed by a resistance measurement block 106 of the gain control circuit 104. Once a voice coil resistance value associated with the speaker 124 is determined by the resistance measurement block 106, an estimated voice coil temperature (T_EST) is determined by temperature estimation block 108 using the voice coil resistance value. The T_EST value is provided to a gain selection block 110. In some examples, the gain selection block 110 compares T_EST to a threshold temperature value (T_DGT). If T_EST is less than T_DGT, the gain selection block 110 selects a base gain value (G_BASE) as the gain value provided to the power control circuit 105. On the other hand, if T_EST is equal to or greater than T_DGT, the gain selection block 110 selects a reduced gain value as the gain value provided to the power control circuit 105. In some examples, the reduced gain value is a function of the G_BASE and a variable gain reduction factor. In one example, the variable gain reduction factor is a function of a maximum supported ambient temperature value (T_AM), T_EST, a temperature rating for the speaker voice coil (T_CR), a calibration temperature value (T_CAL), and T_DGT. In some examples, T_CAL is the ambient temperature at which the system 100 is calibrated. More specifically, in some examples, the reduced gain value is given as:

$$G\_RED = G\_BASE \times \left(1 - \frac{T\_AM - T\_CAL}{T\_CR - T\_CAL}\left(\frac{T\_EST - T\_DGT}{T\_CR - T\_DGT}\right)\right),$$ Equation (1)

By providing G_BASE when T_EST is less than T_DGT and G_RED when T_EST is equal to or greater than T_DGT, the gain control circuit 104 operates to increase T_EST over time subject to certain constraints such as a control loop set point, T_AM, T_CR, and T_CAL. In different examples, T_DGT is varied to adjust the offset between T_EST and T_CR over time. Also, the values for T_DGT, T_CAL, T_AM, T_CR, and G_BASE are determined, selected, stored, and/or adjusted as needed. In some examples, control signals 134 are used to convey one or more values for T_DGT, T_CAL, T_AM, T_CR, and G_BASE to the gain control circuit 104. In some examples, values for T_CAL are determined during calibration of the system 100. Meanwhile, values for T_AM, T_CR, and/or G_BASE correspond to stored values and/or values conveyed to the gain control circuit 104 by control signals 134.

In different examples, the filter circuit 102, the power control circuit 105, the gain control circuit 104, the DAC 128, the amplifier 122, the voltage/current sensor 126, and the ADC 130 are part of one or more integrated circuits. FIG. 2 shows a block diagram 200 of system components in accordance with various examples. In block diagram 200, a digital signal processor (DSP) 202 in communication with a memory 204 (e.g., RAM, ROM, flash memory) is represented, where the memory 204 stores filter instructions 102A, power control instructions 105A, and gain control instructions 104A to perform the operations described for the filter circuit 102, the power control circuit 105, and the gain control circuit 104 of FIG. 1. In some examples, the DSP 202 corresponds to a specialized microprocessor for use in an audio signal processing scenario. In other examples, a general-purpose processor or other programmable component is used instead of the DSP 202. In some examples, the memory 204 is separate from the DSP 202 as represented in FIG. 2. In other examples, the memory 204 is part of the DSP 202. In different examples, the DSP 202 and the memory 204 correspond to one or more integrated circuits. In operation, the DSP 202 receives AS2 and outputs AS3 (see FIG. 1), where AS3 is a filtered version of AS2, and where filtering operations are based in part on the power limit selected as described herein.

FIG. 3 shows a cross-sectional view of a speaker 124A and a gain control block 324 for the speaker 124A in accordance with various examples. The speaker 124A of FIG. 3 is an example of the speaker 124 in FIG. 1, and the gain control block 324 represents hardware and/or software to perform a gain control algorithm such as the gain control algorithm given in the gain control block 324. In at least some embodiments, the gain control block 324 corresponds to the gain control circuit 104 of FIG. 1 and/or the gain control instructions 104A of FIG. 2. The purpose of the gain control block 324 is to provide temperature control that balances heat management and performance (loudness) of the speaker 124A.

As shown, the speaker 124A comprises a voice coil 310 that surrounds a magnet 305, where magnetic circuit components 302 and 304 result in a magnetic field 306 that interacts with the voice coil 310. A diaphragm 308 is attached to the voice coil 310 and to a frame 316. During operations of the speaker 124A, the diaphragm 308 has a directional displacement 318 due to movement of the voice coil 310 and the characteristics (e.g., rigidity/flexibility) of suspension material 312 between the diaphragm 308 and the frame 316. Due to electrical resistance of the voice coil 310 and movement of the diaphragm 308 and suspension material 312, heat is generated during operations of the speaker 124A.

To provide temperature control that balances heat management and loudness of the speaker 124A, the gain control block 324 employs a gain control algorithm. In at least some examples, the gain value provided by the gain control block 324 is used by a power control circuit (e.g., power control circuit 105 in FIG. 1) to provide a power limit for the audio that is played on the speaker 124A. Also, in at least some examples, the frame 316 includes ventilation gaps 314 to help move heat away from the diaphragm 308 and/or other components of the speaker 124A. As shown, the gain control algorithm employed by the gain control block 324 is given as:

$$\begin{cases} G\_BASE, \quad T\_EST < T\_DGT \\ G\_BASE \times \left(1 - \frac{T\_AM - T\_CAL}{T\_CR - T\_CAL}\left(\frac{T\_EST - T\_DGT}{T\_CR - T\_DGT}\right)\right), \\ \quad T\_DGT \le T\_EST \le T\_CR \end{cases} \quad \text{Equation (2)}$$

In Equation 2, G_BASE is selected as the gain value when T_EST is less than T_DGT. On the other hand, when T_EST is equal to one of or is between T_DGT and T_CR, a reduced gain value (G_RED) is selected, where G_RED is determined using Equation 1 as discussed previously. In order to determine G_RED, various predetermined, measured, or selected values are used as described herein (e.g., G_BASE, T_DGT, T_CR, T_AM, T_CAL, T_EST). In some examples, T_EST values are determined using voltage and current measurements (represented by arrow 320) provided to the gain control block 324. More specifically, in some examples, the voltage and current measurements are used to calculate a voice coil resistance, and T_EST is obtained from the voice coil resistance.

Also, in some examples, the other values used by the gain control block 324 are either determined by the gain control block 324 or are dynamically provided to the gain control block 324 from other components (e.g., sensors, control signals, communication interfaces, and/or memory) as needed. In another example, the gain control block 324 stores at least some predetermined values that are fixed rather than dynamically updated for a given speaker scenario (e.g., G_BASE, T_DGT, T_CR, T_CAL, and/or T_AM are fixed for a given audio signal amplification scenario). In some examples, G_BASE has a value between 1.0-3.0, T_DGT has a value between 60-85 degrees Celsius, T_CR has a value between 90-100 degrees Celsius, T_CAL has a value between 20-30 degrees Celsius, and T_AM has a value between 50-70 degrees Celsius.

In at least some examples, the output of the gain control block 324 (e.g., G_BASE or G_RED) is provided to a power control circuit, which determines a power limit used to produce an audio signal represented by arrow 322 for the speaker 124A. The audio signal causes current to pass through the voice coil 310, which causes displacement 318 of the voice coil 310 in presence of a magnetic field. The displacement 318 of the voice coil 310 results in movement of the diaphragm 308, which produces audible sound. With the operations of the gain control block 324, the voice coil 310 receives sufficient current to raise the temperature of the voice coil 310 towards its maximum temperature rating (T_CR) without passing the maximum temperature rating.

Figure 4:
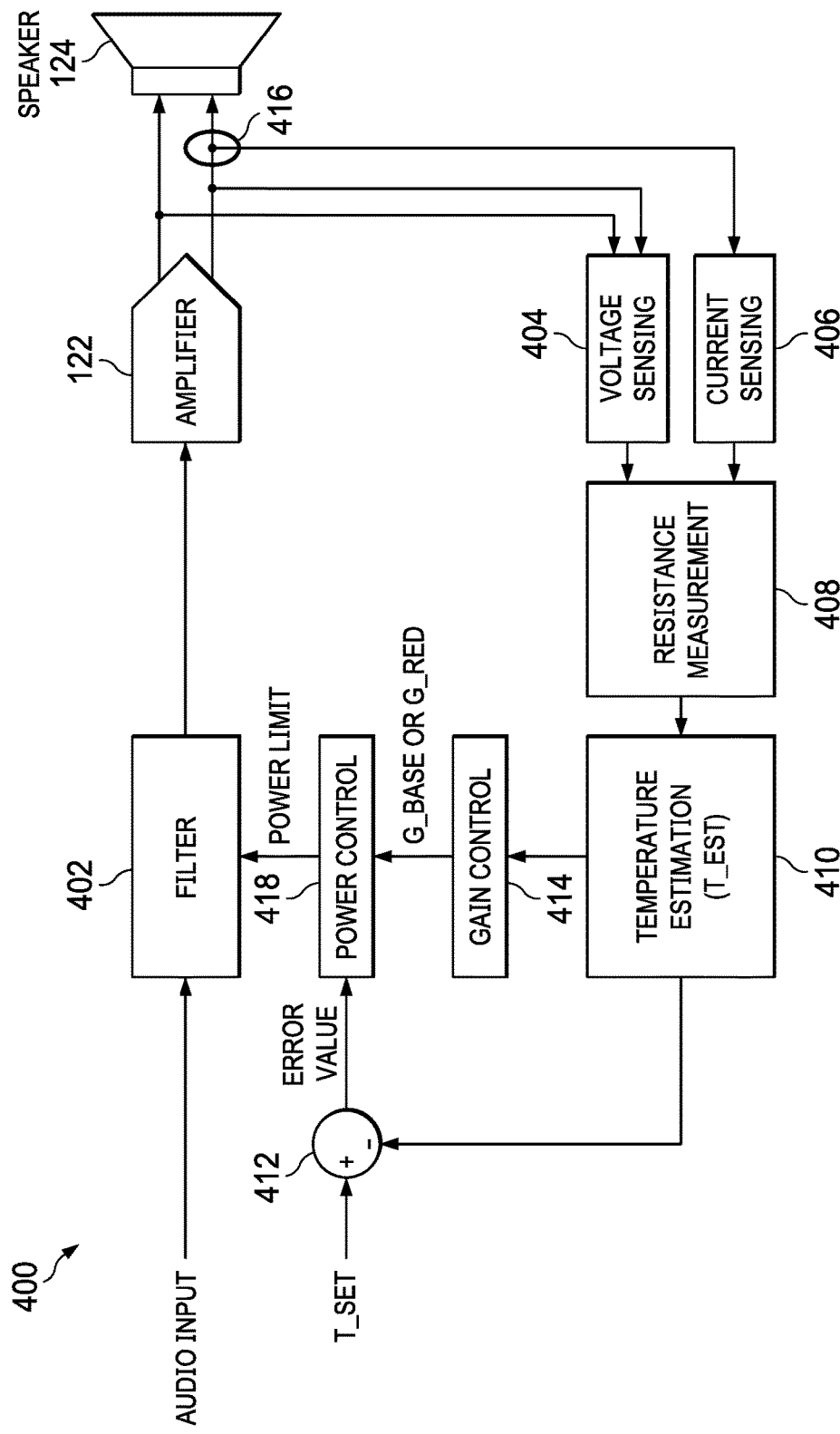
FIG. 4 shows a block diagram of audio amplification technique in accordance with various examples.

FIG. 4 shows a block diagram of an audio amplification technique 400 in accordance with various examples. In technique 400, various components and functional blocks are represented, including the amplifier 122 and the speaker 124 introduced in FIG. 1. In addition, the technique 400 includes voltage sensing at block 404 and current sensing at block 406. In the example of FIG. 4, a conductive loop 416 along the conductive path between the amplifier 122 and the speaker 124 is used to provide a current sense value to block 406. In some examples, blocks 404 and 406 are performed by the voltage/current sensor 126 of FIG. 1. At block 408, a resistance measurement is performed to determine a voice coil resistance based on voltage and current measurements obtained at block 404 and 406.

At block 410, an estimated temperature of the voice coil (T_EST) is determined from the voice coil resistance determined at block 408. T_EST is provided to a gain control block 414 (an example of the gain control circuit 104 in FIG. 1, the gain control instructions 104A in FIG. 2, the gain control block 324 in FIG. 3), which performs gain control operations as described herein. The gain control block 414 provides a gain value to a power control block 418, which also receives an error value from a compare block 412. More specifically, the compare block 412 determines the error value by comparing T_EST with a temperature set-point (T_SET) corresponding to a starting point for the control loop. In some examples, T_SET is given as:

$$T\_SET = (T\_AM - T\_A0) \times \frac{G\_BASE + 1}{G\_BASE}. \quad \text{Equation (3)}$$

The power control block 418 (an example of the power control circuit 105 in FIG. 1 or the power control instructions 105A in FIG. 2) uses the error value from the compare block 412 and the gain value from the gain control block 414 to determine a power limit value. In some examples, the power control block 414 multiples the gain value by the error value to determine the power limit value. In some examples, the power control block 414 multiplies the gain value and the error value and the output is passed through a filter (separate from the filter block 402) to determine the power limit value. The power limit value is provided to a filter block 402 (an example of the filter circuit 102 in FIG. 1 or the filter instructions 102A in FIG. 2), which adjusts audio input values based on the power limit value. The output of the filter block 402 is used by the amplifier 122 to provide an audio signal to the speaker 124.

Figure 5:
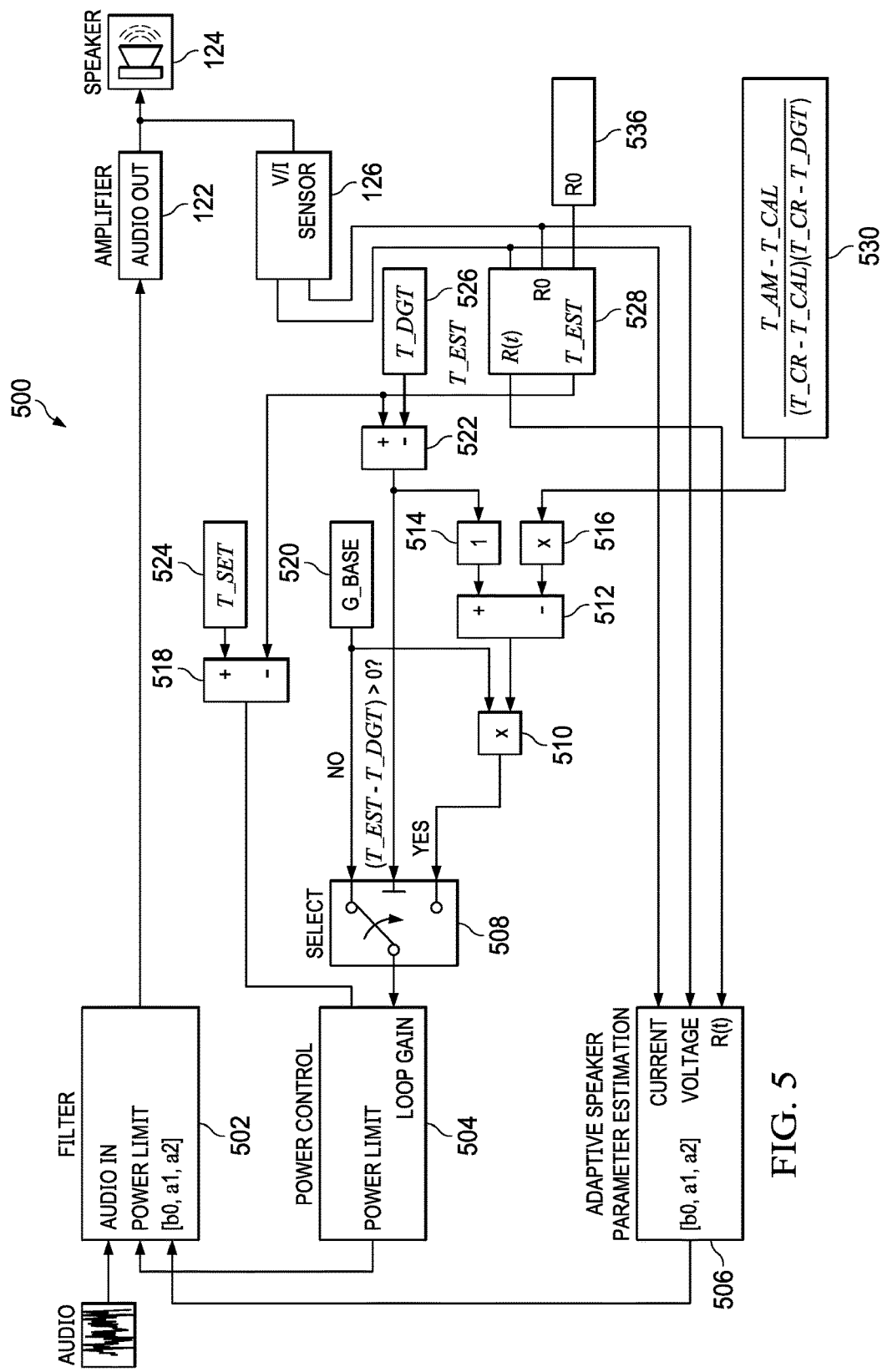
FIG. 5 shows a block diagram of an audio amplification system in accordance with various examples.

FIG. 5 shows a block diagram of an audio amplification system 500 in accordance with various examples. As shown, the audio amplification system 500 includes the amplifier 122, the speaker 124, and the voltage/current sensor 126 introduced in FIG. 1. The outputs of the voltage/current sensor 126 are provided to a calculation block 528 that determines a voice coil resistance, R(t), based on a predetermined resistance value (RO) from block 536, and the voltage and current measurements from the voltage/current sensor 126. The calculation block 528 determines T_EST based on R(t). The difference between T_EST and T_DGT is determined by calculation block 522. If T_EST−T_DGT is greater than 0, a reduced gain value (G_RED) is selected by selection block 508, and is provided to a power control block 504 (an example of the power control circuit 105 in FIG. 1, the power control instructions 105A in FIG. 2, or the power control block 418 in FIG. 4). The value for G_RED is given in Equation 1, where various gain control operations related to Equation 1 correspond to blocks 510, 512, 514, 516 in FIG. 5. Also, various values used in Equation 1 are provided by blocks 524, 526, and 530, which corresponds to storage or memory, where the stored values are fixed or are updated over time as needed. If T_EST−T_DGT is not greater than 0, G_BASE is selected by the selection block 508, and is provided to the power control block 504. The power control block 504 uses the gain value (G_BASE or G_RED) selected by the selection block 508 and the error value corresponding to T_SET−T_EST to provide a power limit value to a filter block 502 (an example of the filter circuit 102 in FIG. 1, the filter instructions 102A in FIG. 2, or the filter block 402 in FIG. 4). In some examples, the filter block 502 also receives filter coefficients (e.g., b0, a1, a2) from an adaptive speaker parameter estimation block 506. In at least some examples, the filter coefficients are determined using the voltage and current measurements from the voltage/current sensor 126 and the voice coil resistance, R(t), from calculation block 528. The filter block 502 uses the filter coefficients from the adaptive speaker parameter estimation block 506 and the power limit value from the power control block 504 to adjust an input audio signal. The output from the filter block 502 is provided to the amplifier 122.

As previously noted, in some examples, the filter block 502 corresponds to the filter circuit 102 of FIG. 1, the filter instructions 102A in FIG. 2, or the filter block 402 of FIG. 4. Meanwhile, blocks 510, 512, 514, 516, 508, 522, 520 correspond to the gain control circuit 104 of FIG. 1, the gain control instructions 104A of FIG. 2, the gain control block 324 of FIG. 3, or the gain control block 414 of FIG. 4. In some examples, the system 100 of FIG. 1 employs adaptive speaker parameter estimation (e.g., the adaptive speaker parameter estimation block 506). In such examples, the filter circuit 102 of FIG. 1 uses filter coefficients (e.g., b0, a1, a2) along with a power limit value to provide AS3 based on AS2. The filter coefficients enable the filter block 502 to account for changes to the speaker 124 over time, such that excursion and temperature are maintained within a desired safety limit.

Figure 6:
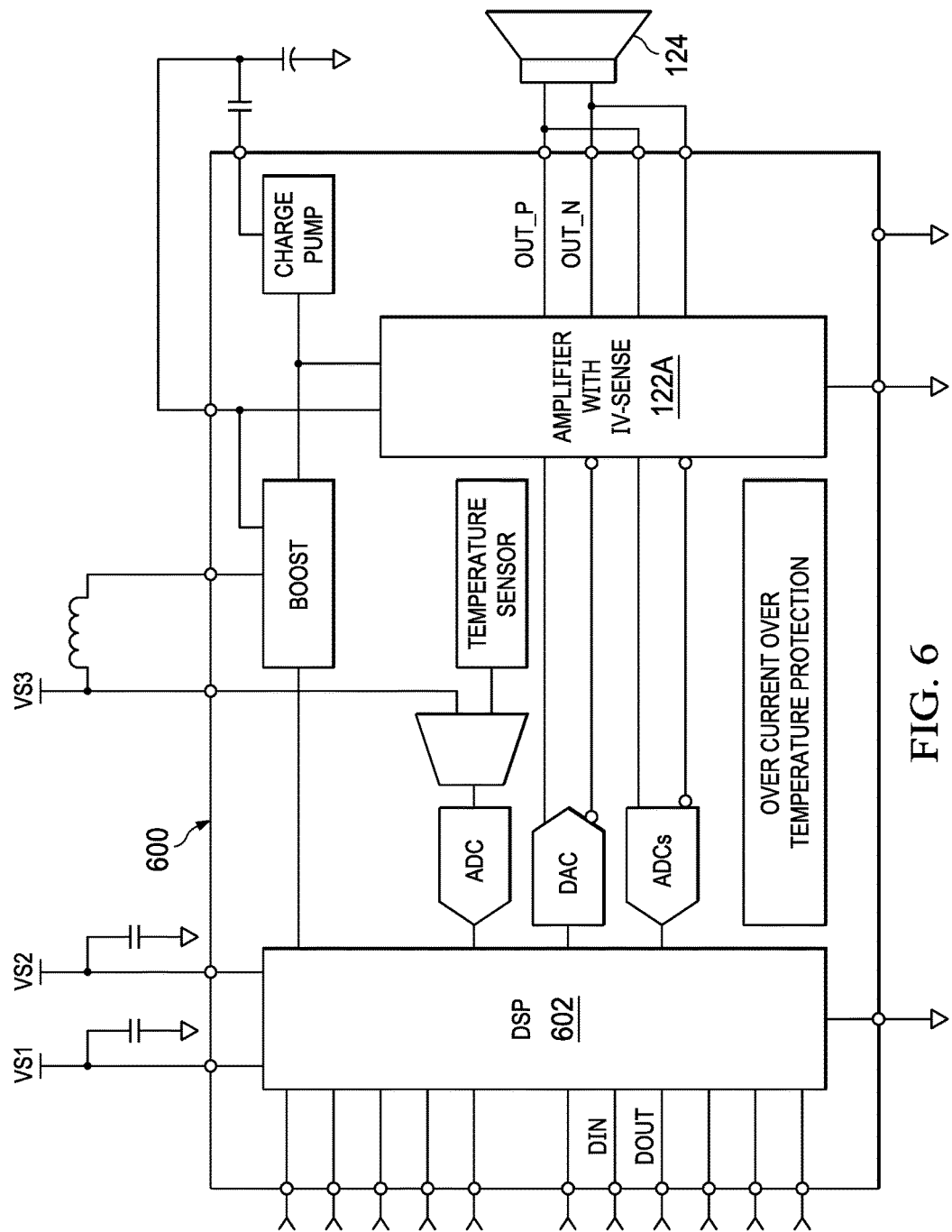
FIG. 6 shows an amplifier device in accordance with various examples.

FIG. 6 shows an amplifier device 600 in accordance with various examples. As shown, the amplifier device 600 includes a DSP 602. In some examples, the DSP 602 corresponds to the filter circuit 102, the power control circuit 105, and the gain control circuit 104 of FIG. 1. In some examples, the DSP 602 corresponds to the DSP 202 of FIG. 2. In some examples, the DSP 602 performs the gain control algorithm represented in the gain control block 324 of FIG.

3. In some examples, the DSP 602 corresponds to at least the gain control block 414, the power control block 418, and the filter block 402 of FIG. 4. In some examples, the DSP 602 corresponds to at least the filter block 502, the power control block 504, blocks 510, 512, 514, 516, 508, 522 520 (gain control), and the adaptive speaker parameter estimation block 506 of FIG. 5.

In FIG. 6, the DSP 602 is powered by one or more voltage supply signals (e.g., VS1 and VS2) and couples to ground. In operation, the DSP 602 receives an input data stream (DIN) corresponding to an audio signal (e.g., AS2) and provides an output signal to an amplifier 122A (e.g., an example of amplifier 122), where the amplifier 122A includes voltage/current sensing. In some examples, the DSP 602 also provides an output data stream (DOUT) to communicate with other components outside the amplifier device 600. In different examples, the DSP 602 includes other inputs such as clock signals and control signals. As shown, the amplifier device 600 of FIG. 6 includes other components such as ADCs, DACs, voltage supply circuitry, a multiplexer, a temperature sensor, a boost circuit, a charge pump, and an overcurrent/overtemp protection circuit. In other amplifier device examples, one or more of these other components are omitted. Also, in some amplifier device examples, other components are used. In FIG. 6, the amplifier 122A provides differential output signals (OUT_P and OUT_N) to the speaker 124. Also, differential sense inputs are received by the amplifier 122A from the conductive paths between the amplifier 122A and the speaker 124. The differential sense inputs are used to determine voltage and current measurements. As desired, amplifier devices such as the amplifier device 600 of FIG. 6 are included with a consumer device with a speaker (e.g., a cellular phone or tablet) to balance excursion control and loudness of the speaker as described herein.

Figure 7:
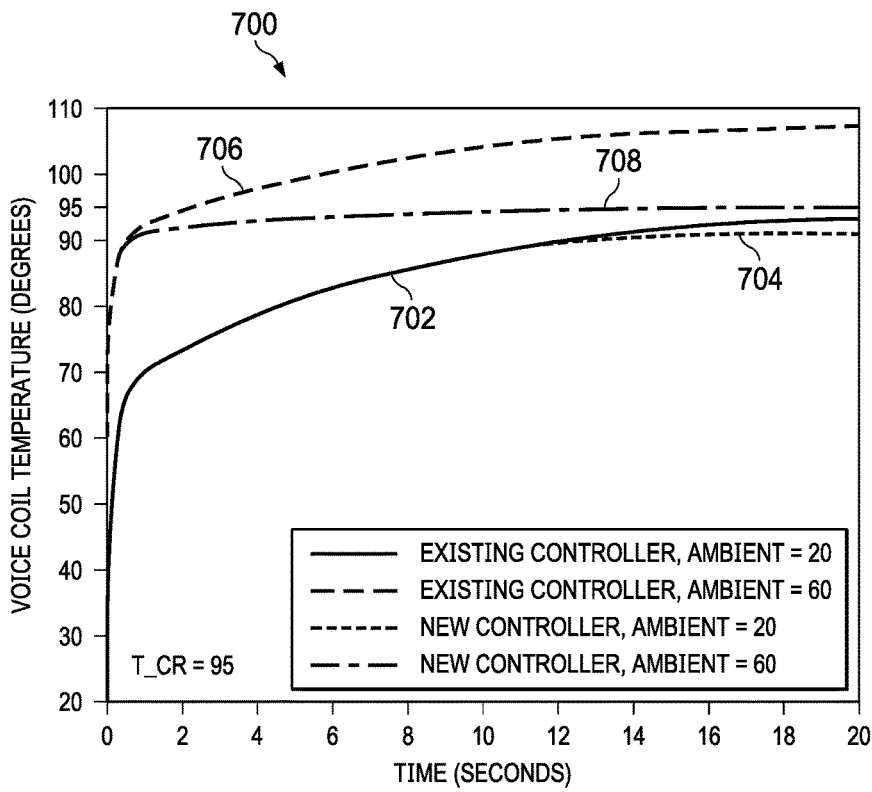
FIG. 7 shows a graph comparing voice coil temperature curves as a function of time for different gain control options and ambient temperatures in accordance with various examples.

FIG. 7 shows a graph 700 comparing voice coil temperature curves as a function of time for different gain control options and ambient temperatures in accordance with various examples. For graph 700, T_CR is 95 degrees Celsius. More specifically, curve 702 shows voice coil temperature as a function of time, where an existing gain control option is used and the ambient temperature is 20 degrees Celsius. Meanwhile, curve 704 shows voice coil temperature as a function of time, where gain control as described in FIGS. 1, 2, 3, 4, 5, and/or 6 is used, and where the ambient temperature of 20 degrees Celsius. Compared to curve 702, curve 704 maintains an offset from T_CR over time.

In FIG. 7, curve 706 corresponds to voice coil temperature as a function of time, where an existing gain controller is used and the ambient temperature is 60 degrees Celsius. Meanwhile, curve 708 corresponds to voice coil temperature as a function of time, where gain control as described in FIGS. 1, 2, 3, 4, 5, and/or 6 is used, and where the ambient temperature is 60 degrees Celsius. As shown, curve 706 increases above T_CR over time, indicating the existing gain control option does not provide proper speaker protection when the ambient temperature is 60 degrees Celsius. In contrast, curve 708 maintains the voice coil temperature at T_CR over time even when the ambient temperature is 60 degrees Celsius. Note: the ambient temperature varies in different scenarios and thus 60 degrees Celsius is merely an example.

Figure 8:
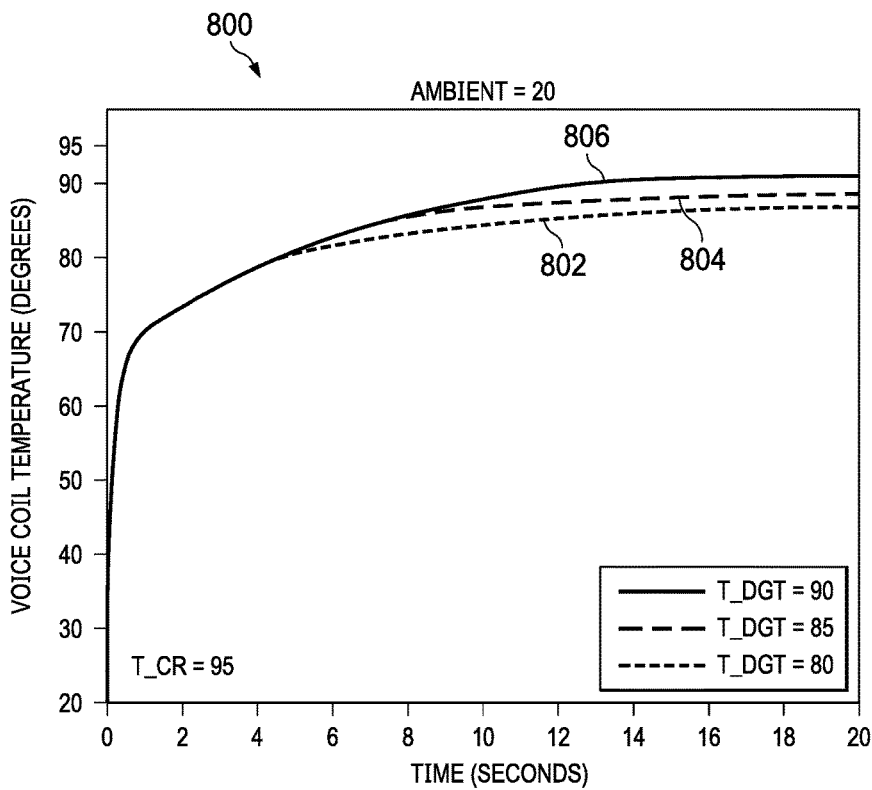
FIG. 8 shows a graph comparing voice coil temperature curves as a function of time for different temperature threshold values and a first ambient temperature in accordance with various examples.

FIG. 8 shows a graph 800 comparing voice coil temperature curves as a function of time for different temperature threshold values (T_DGT) and a first ambient temperature in accordance with various examples. For graph 800, the ambient temperature is 20 degrees Celsius and T_CR is 95 degrees Celsius. In FIG. 8, curve 802 shows voice coil temperature as a function of time when T_DGT is 80 degrees Celsius. Meanwhile, curve 804 shows voice coil temperature as a function of time when T_DGT is 85 degrees Celsius. Finally, curve 806 shows voice coil temperature as a function of time when T_DGT is 90 degrees Celsius. As shown in graph 800, the curves 802, 804, and 806 are initially similar, then vary over time, where an increased T_DGT decreases the offset between T_CR and the voice coil temperature over time.

Figure 9:
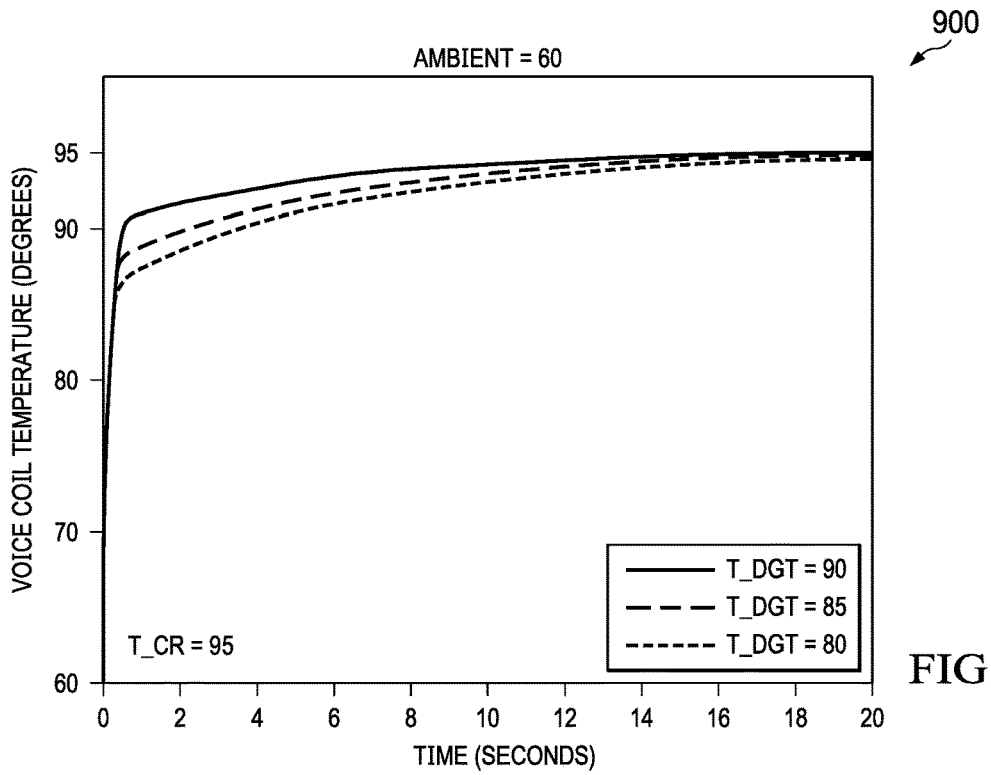
FIG. 9 shows a graph comparing voice coil temperature curves as a function of time for different temperature threshold values and a second ambient temperature in accordance with various examples.

FIG. 9 shows a graph 900 comparing voice coil temperature curves as a function of time for different temperature threshold values (T_DGT) and a second ambient temperature in accordance with various examples. For graph 900, the ambient temperature is 60 degrees Celsius and T_CR is 95 degrees Celsius. In FIG. 9, curve 902 shows voice coil temperature as a function of time when T_DGT is 80 degrees Celsius. Meanwhile, curve 904 shows voice coil temperature as a function of time when T_DGT is 85 degrees Celsius. Finally, curve 906 shows voice coil temperature as a function of time when T_DGT is 90 degrees Celsius. As shown in graph 900, the curves 902, 904, and 906 vary initially, then converge over time, where an increased T_DGT decreases the initial offset between T_CR and the voice coil temperature.

Figure 10:
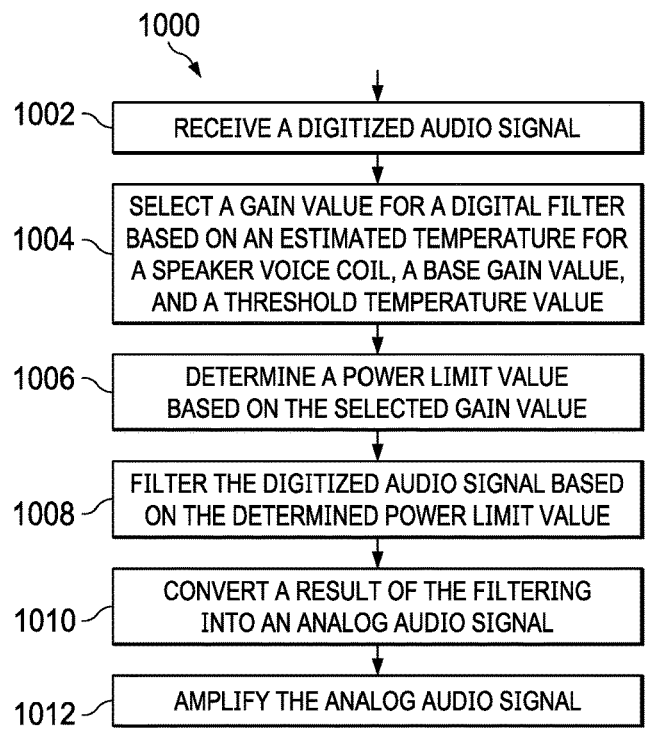
FIG. 10 shows a flowchart of an audio signal amplification method in accordance with various examples.

FIG. 10 shows a flowchart of an audio signal amplification method 1000 in accordance with various examples. As shown, the method 1000 comprises receiving a digitized audio signal at block 1002. At block 1004, a gain value is selected (e.g., G_BASE or G_RED) for a power control block (e.g. the power control circuit 105 of FIG. 1) which determines the power limit of a digital filter (e.g., the filter circuit 102 of FIG. 1) based on an estimated temperature for a speaker voice coil (e.g., T_EST), a base gain value (e.g., G_BASE), and a threshold temperature value (e.g., T_DGT). The selected gain value is used to determine power limit value at block 1006. In some examples, the power limit value is determined by adjusting the selected gain value based on an error value (e.g., power limit value=error value*selected gain value or a filtered version of error value*selected gain value) as described herein. In one example, the error value is given as T_SET−T_EST. At block 1008, the digitized audio signal is filtered based on the determined power limit value. At block 1010, a result of the filtering is converted into an analog audio signal. At block 1012, the analog audio signal is amplified.

In some examples, the method 1000 further comprises obtaining voltage and current measurements of a speaker (e.g., speaker 124), and determining the estimated temperature for the speaker voice coil (e.g., T_EST) based on the voltage and current measurements. In some examples, selecting the gain value at block 1004 comprises selecting the base gain value (e.g., G_BASE) as the gain value when the estimated temperature (e.g., T_EST) is less than the threshold temperature value (e.g., T_DGT). Alternatively, selecting the gain value at block 1004 comprises selecting a reduced gain value (e.g., G_RED), relative to the base gain value (e.g., G_BASE), as the gain value when the estimated temperature (e.g., T_EST) is equal to or greater than the threshold temperature value (T_DGT). In some examples, the reduced gain value (e.g., G_RED) is given in Equation 1.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. For example, it is possible to set the gain value as a fixed value, and dynamically adjust T_SET based on T_DGT. In this example, a power limit value is determined based on G_BASE (fixed) and (T_SET−T_EST), where T_SET is dynamically adjusted. It is intended that the following claims be interpreted to embrace all such variations and modifications.

What is claimed is:

1. A system that comprises:
   a gain control circuit configured to dynamically select a gain value based on an estimated temperature for a speaker voice coil, a base gain value, and a threshold temperature value;
   a power control circuit configured to determine a power limit value based on the gain value;
   a filter circuit configured to adjust values of a digitized audio signal based on the power limit value; and
   a digital-to-analog converter (DAC) coupled to the filter circuit and configured to convert a digital output of the filter circuit to an analog audio signal.

2. The system of claim 1, further comprising an amplifier configured to receive the analog audio signal and to provide an amplified version of the analog audio signal to a speaker associated with the speaker voice coil.

3. The system of claim 2, wherein the filter circuit, the power control circuit, the gain control circuit, the DAC, and the amplifier are components of an integrated circuit.

4. The system of claim 2, further comprising voltage and current sensors configured to provide voltage and current measurements of the speaker, wherein outputs from the voltage and current sensors are used to determine the estimated temperature for the speaker voice coil.

5. The system of claim 1, wherein the gain control circuit selects the base gain value as the gain value when the estimated temperature is less than the threshold temperature value, and wherein the gain control circuit selects a reduced gain value, relative to the base gain value, as the gain value when the estimated temperature is equal to or greater than the threshold temperature value.

6. The system of claim 5, wherein a reduced gain value is a function of the base gain value and a variable gain reduction factor that is a function of the threshold temperature value, a maximum supported ambient temperature value, a calibration temperature, the estimated temperature of the speaker voice coil, and a temperature rating for the speaker voice coil.

7. The system of claim 6, wherein a reduced gain value is given as:

$$G\_BASE * \left(1 - \left(\frac{T\_AM - T\_CAL}{T\_CR - T\_CAL}\right)\left(\frac{T\_EST - T\_DGT}{T\_CR - T\_DGT}\right)\right),$$

where G_BASE is the base gain value, T_DGT is the threshold temperature value, T_AM is the maximum supported ambient temperature value, T_EST is the estimated temperature of the speaker voice coil, T_CR is the temperature rating for the speaker voice coil, and T_CAL is a calibration temperature.

8. The system of claim 2, wherein the filter circuit, the power control circuit, and the gain control circuit correspond to a digital signal processor in communication with a memory that stores filter instructions, power control instructions, and gain control instructions.

9. An amplifier device that comprises:
   circuitry configured to dynamically select a gain value based on an estimated temperature for a speaker voice coil, a base gain value, and a threshold temperature value, to determine a power limit value based on the gain value, and to filter a digitized audio signal based on the power limit value;
   a digital-to-analog converter (DAC) coupled to the circuitry and configured to convert a digital output of the circuitry to an analog audio signal; and
   an amplifier configured to receive the analog audio signal and to provide an amplified version of the analog audio signal to a speaker associated with the speaker voice coil.

10. The amplifier device of claim 9, wherein the circuitry, the DAC, and the amplifier are components of an integrated circuit.

11. The amplifier device of claim 9, further comprising voltage and current sensors configured to provide voltage and current measurements of the speaker, wherein the circuitry is configured to determine the estimated temperature based on voltage and current measurements from the voltage and current sensors.

12. The amplifier device of claim 11, further comprising analog-to-digital converters (ADCs) configured to convert voltage and current measurements from the voltage and current sensors to provide digitized voltage and current measurements of the speaker to the circuitry.

13. The amplifier device of claim 9, wherein the circuitry selects the base gain value as the gain value when the estimated temperature is less than the threshold temperature value, and wherein the circuitry selects a reduced gain value, relative to the base gain value, as the gain value when the estimated temperature is equal to or greater than the threshold temperature value.

14. The amplifier device of claim 13, wherein the reduced gain value is given as:

$$G\_BASE * \left(1 - \left(\frac{T\_AM - T\_CAL}{T\_CR - T\_CAL}\right)\left(\frac{T\_EST - T\_DGT}{T\_CR - T\_DGT}\right)\right),$$

where G_BASE is the base gain value, T_DGT is the threshold temperature value, T_AM is a maximum supported ambient temperature value, T_EST is the estimated temperature of the speaker voice coil, T_CR is a temperature rating for the speaker voice coil, and T_CAL is a calibration temperature.

15. An audio signal amplification method that comprises:
   receiving a digitized audio signal;

selecting a gain value for a digital filter based on an estimated temperature for a speaker voice coil, a base gain value, and a threshold temperature value;
determining a power limit value based on the gain value;
filtering the digitized audio signal based on the power limit value;
converting a result of said filtering into an analog audio signal; and
amplifying the analog audio signal.

16. The method of claim 15, further comprising:
obtaining voltage and current measurements of a speaker associated with the speaker voice coil; and
determining the estimated temperature for the speaker voice coil based on voltage and current measurements.

17. The method of claim 16, further comprising:
converting the voltage and current measurements to digitized voltage and current measurements, wherein said determining the estimated temperature is based on the digitized voltage and current measurements.

18. The method of claim 15, wherein selecting the gain value comprises:
selecting the base gain value as the gain value when the estimated temperature is less than the threshold temperature value; and
selecting a reduced gain value, relative to the base gain value, as the gain value when the estimated temperature is equal to or greater than the threshold temperature value.

19. The method of claim 15, wherein a reduced gain value is given as:

$$G\_BASE * \left(1 - \left(\frac{T\_AM - T\_CAL}{T\_CR - T\_CAL}\right)\left(\frac{T\_EST - T\_DGT}{T\_CR - T\_DGT}\right)\right),$$

where G_BASE is the base gain value, T_DGT is the threshold temperature value, T_AM is a maximum supported ambient temperature value, T_EST is the estimated temperature of the speaker voice coil, T_CR is a temperature rating for the speaker voice coil, and T_CAL is a calibration temperature.

20. The method of claim 19, wherein determining the power limit value comprises adjusting the gain value based on an error value.

* * * * *